(12) United States Patent
Cox

(10) Patent No.: US 7,495,887 B2
(45) Date of Patent: Feb. 24, 2009

(54) CAPACITIVE DEVICES, ORGANIC DIELECTRIC LAMINATES, AND PRINTED WIRING BOARDS INCORPORATING SUCH DEVICES, AND METHODS OF MAKING THEREOF

(75) Inventor: G. Sidney Cox, Durham, NC (US)

(73) Assignee: E.I. du Pont de Nemours and Company, Wilmington, DE (US)

(*) Notice: Subject to any disclaimer, the term of this patent is extended or adjusted under 35 U.S.C. 154(b) by 306 days.

(21) Appl. No.: 11/304,779

(22) Filed: Dec. 15, 2005

(65) Prior Publication Data

US 2006/0133011 A1 Jun. 22, 2006

Related U.S. Application Data

(60) Provisional application No. 60/648,726, filed on Feb. 1, 2005, provisional application No. 60/637,816, filed on Dec. 21, 2004.

(51) Int. Cl.
*H01G 4/06* (2006.01)
(52) U.S. Cl. ............... 361/321.4; 361/321.5; 361/311; 361/313; 361/306.1; 361/306.3
(58) Field of Classification Search ......... 361/321.1, 361/321.4, 321.5, 311–313, 306.1, 306.3, 361/321.2, 302–305
See application file for complete search history.

(56) References Cited

U.S. PATENT DOCUMENTS

| | | | |
|---|---|---|---|
| 3,287,311 A | 11/1966 | Edwards | |
| 5,079,069 A | 1/1992 | Howard et al. | |
| 5,162,977 A | 11/1992 | Paurus et al. | |
| 5,298,331 A | 3/1994 | Kanakarajan et al. | |
| 5,586,301 A | 12/1996 | Fisherman et al. | |
| 6,072,689 A * | 6/2000 | Kirlin | 361/311 |
| 6,183,592 B1 | 2/2001 | Sylvester | |
| 6,215,649 B1 * | 4/2001 | Appelt et al. | 361/312 |
| 6,284,655 B1 | 9/2001 | Marsh | |
| 6,323,511 B1 | 11/2001 | Marsh | |
| 6,403,414 B2 | 6/2002 | Marsh | |
| 6,495,458 B2 | 12/2002 | Marsh | |
| 6,600,645 B1 | 7/2003 | Lauf et al. | |
| 6,657,849 B1 * | 12/2003 | Andresakis et al. | 361/311 |
| 6,661,642 B2 * | 12/2003 | Allen et al. | 361/312 |
| 6,819,540 B2 * | 11/2004 | Allen et al. | 361/302 |

FOREIGN PATENT DOCUMENTS

| | | |
|---|---|---|
| EP | 1 020 487 A1 | 7/2000 |
| EP | 1 369 399 A1 | 12/2003 |
| JP | 57-011407 | 1/1980 |

* cited by examiner

Primary Examiner—Nguyen T Ha

(57) ABSTRACT

A polymeric dielectric composition is disclosed, having a paraelectric filler with a dielectric constant between 50 and 150. Such compositions are well suited for electronic circuitry, such as, multilayer printed circuits, flexible circuits, semiconductor packaging and buried film capacitors.

9 Claims, 3 Drawing Sheets

CAPACITIVE DEVICES, ORGANIC DIELECTRIC LAMINATES, AND PRINTED WIRING BOARDS INCORPORATING SUCH DEVICES, AND METHODS OF MAKING THEREOF

BACKGROUND INFORMATION

1. Field of the Disclosure

The technical field relates to dielectric composition(s) and film(s) and their use in electronic circuitry and components, such as, multilayer printed circuits, flexible circuits, semiconductor packaging and buried film capacitors.

2. Description of Related Art

An increasing need exists for reducing the size and increasing the performance of integrated circuit components. One common part of the integrated circuit components, for example planar capacitor components, includes a dielectric layer that is formed from a composition comprising a dielectric functional filler material and a polymer. Typically, using a dielectric functional filler material having a high dielectric constant, K, in a capacitor allows for storage of the same amount of electrical charge for a given thickness of the dielectric layer in a reduced capacitor area versus that containing no filler.

Various types of dielectric layers are currently being used in the processing of circuit board capacitors. However, the dielectric constant of the dielectric layer is limited and problems exist in regard to certain electrical properties, such as low dielectric withstanding voltage and high leakage current. Both of these problems limit the capability of the final capacitor and, in many cases, limit the ability to decrease the thickness of the dielectric layer within the capacitor to the desired level.

U.S. Pat. No. 5,079,069 to Howard et. al. is directed to capacitor laminates for use in capacitive printed circuit boards.

SUMMARY

Accordingly, the present inventor desired to provide dielectric compositions and films for use in capacitor formation in electronic components that have desirable electrical and physical properties, such as high dielectric withstanding voltage and low leakage current. These dielectric compositions and films are especially useful in embedded passive applications.

The present invention provides such compositions, films, device and method of making such device. The present invention relates to dielectric composites comprising a paraelectric filler and polymeric material where the combination has a dielectric constant between 50 and 150. The present invention further relates to the composition above wherein said composition has been processed to form a film and a capacitor comprising the film.

A further embodiment of the present invention is a capacitor comprising the dielectric composition above disposed between two conductive electrodes and a printed wiring board comprising said capacitor. Still a further embodiment relates to a method of forming an embedded planar capacitor comprising: providing the dielectric composition above; applying said dielectric composition to a first metallic layer, thus forming a metallic side and a dielectric side; and applying a second metallic layer to said dielectric side. A further embodiment is a planar capacitor formed by the method above.

Capacitors constructed utilizing the composition of the present invention generally have high capacitance densities and other desirable electrical and physical properties. The capacitors can be, for example, embedded in printed wiring boards and on integrated circuit substrates, and can be used to form integrated circuit packages and integrated passive devices.

Those skilled in the art will appreciate the above stated advantages and other advantages and benefits of various additional embodiments of the invention upon reading the following detailed description of the embodiments with reference to the below-listed drawings.

According to common practice, the various features of the drawings discussed below are not necessarily drawn to scale. Dimensions of various features and elements in the drawings may be expanded or reduced to more clearly illustrate the embodiments of the invention.

BRIEF DESCRIPTION OF THE DRAWINGS

The detailed description will refer to the following drawings, wherein like numerals refer to like elements, and wherein.

DETAILED DESCRIPTION

The present invention relates to a dielectric composition and dielectric film which allow for improved electrical performance, such as high dielectric withstanding voltage and low leakage current, in electronic circuitry such as multilayer printed circuits, flexible circuits, semiconductor packaging and buried film capacitors. The dielectric composition comprises a paraelectric filler, such as, but not limited to, $TiO_2$, $Ta_2O_5$, $HfO_2$, $Nb_2O_5$, $Al_2O_3$, and Steatite and a polymer. The filler could be any paraelectric filler with a dielectric constant between 10 and 150. The paraelectric filler has a relatively high insulation resistance (low leakage current) and breakdown voltage in bulk form.

Figure 1:
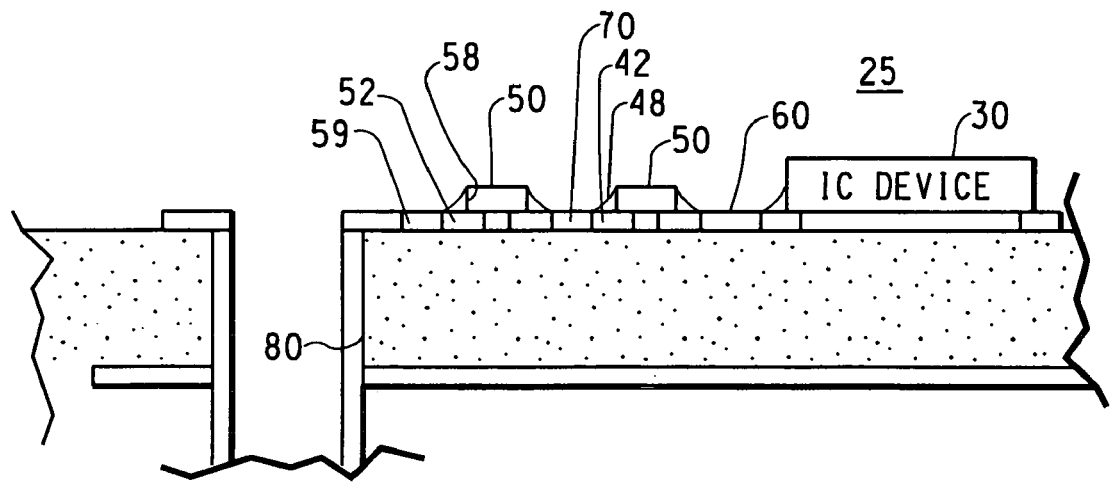
FIG. 1 is a representation in section view in front elevation of a printed wiring board having conventional prior art surface mount technology (SMT) capacitors.

FIG. 1 is a cross section view of a portion of a printed circuit board 25 having surface mount technology (SMT) capacitors 50 connected to an IC device 30 to form a prior art printed circuit board 25. The signal line carrying the signal to the IC 30 is connected to a circuit trace 60 connecting the IC device 30 to the capacitor 50. The capacitors 50 are coupled to a circuit trace 70 by one of a pair of solder pads 52 and solder joints 58 and coupled to the circuit trace 70 by a solder pad 42 and a solder joint 48. The capacitors 50 are coupled to a via hole 80 by the other solder pad 58 and a circuit trace 59. This arrangement places the two capacitors 50 in series with the signal line and connected to ground through a plated through-hole via 80. This conventional surface mount approach requires use of valuable surface real estate. Further, the requirement for solder joints reduces reliability and increases costs of fabrication.

Paraelectric Filler

The paraelectric ceramic filler with a dielectric constant between 10 and 150 and having a high insulation resistance and breakdown voltage is essential to the present invention.

Paraelectric ceramic fillers are defined herein to mean ceramic particles that show a linear response of charge or polarization versus voltage. Paraelectric fillers show a total reversible polarization of charges within the crystal structure after the applied electric filed is removed. Traditionally ferroelectric fillers are used to increase the dielectric constant of a dielectric, because they usually have a higher dielectric constant than paraelectric fillers. The higher dielectric constants of ferroelectric materials are caused by the non-linear response of charge and polarization versus voltage. This non-linear response is a key property of ferroelectric materials. Ferroelectric fillers also show a hysteresis affect with polarization by an applied field because of nonreversible changes in the crystal structure. Although the ferroelectric fillers have higher dielectric constants, they have major negative electrical properties because of the ferroelectric properties. Ferroelectric materials tend to have lower insulation resistance (higher leakage current) than paraelectric materials. Ferroelectric materials also tend to have lower dielectric withstanding voltage and wider variation in capacitance with temperature. To achieve high capacitance for a filled polymer film three factors are available: increase the dielectric constant of the filler powder, increase the concentration of the filler powder, or decrease the thickness of the filled polymer film. Ferroelectric fillers certainly have the advantage of higher dielectric constant. However, the higher dielectric withstanding voltage and lower leakage current of the paraelectric fillers allow these capacitor films to be filled at higher concentrations and be included in thinner films and still achieve all the required electronic properties.

Paraelectric filler powders useful in the present invention include but are not limited to, $TiO_2$, $Ta_2O_5$, $HfO_2$, $Nb_2O_5$, $Al_2O_3$, Steatite and mixtures thereof. These paraelectric materials exhibit high breakdown voltages of approximately 1000 volts per mil or greater and volume resistivities of 10E12 ohm-cm or greater in their bulk form. Typically, the paraelectric filler powder has an average particle size ($D_{50}$) of less than 2 microns. In one embodiment, the average particle size is in the range of 0.1 to 0.3 microns. The paraelectric filler powder is present in the composition in approximately 5 to 55 volume percent.

In one embodiment, the paraelectric filler is $TiO_2$, which has a dielectric constant between 50-117. One example of $TiO_2$ useful in the present invention is Ti-Pure® R101 available from E. I. du Pont de Nemours and Company.

Polymer(s)

The polymers are important to the compositions of this invention. One of the most important features of the polymers are their ability to disperse the paraelectric filler(s) and optional other fillers in the composition. Polymers useful in the present invention include epoxies, acrylics, polyurethanes and polyimides. Suitable polyimides for use in the present invention are disclosed in U.S. Pat. No. 5,298,331 to Kanakarajan et al, herein incorporated by reference.

In one embodiment, the insulation resistance and dielectric withstanding voltage of the paraelectric filler/polymer composition of the present invention are greater than $10^{10}$ ohms per $cm^2$, and greater than 250 volts, respectively, where dielectric withstanding voltage is defined as the voltage the dielectric can withstand for at least 30 seconds.

Additional Components

Other components may be added to the composition such as ferroelectric ceramic fillers, solvents, dispersion agents, adhesive agents, as well as other additives known to those skilled in the art.

Ferroelectric ceramic filler may be added to the composition in various amounts to enhance the electrical properties of the film dependant upon the specific application. Typically, these additional ferroelectric ceramic fillers are present in amount 5 to 25 volume percent. In most cases the ferroelectric filler would be a lower concentration than the paraelectric filler. Specific examples of ferroelectric ceramic fillers that may be added to the composition include: perovskites of the general formula $ABO_3$, crystalline barium titanate (BT), barium strontium titanate (BST), lead zirconate titanate (PZT), lead lanthanum titanate, lead lanthanum zirconate titanate (PLZT), lead magnesium niobate (PMN), and calcium copper titanate, and mixtures thereof. Fillers may be in powder form. These ferroelectric fillers may be used individually or in combination. It is noted that these ferroelectric fillers do not meet the definition of paraelectric filler of the present invention. In one embodiment a suitable barium titanate filler (obtainable from Tam Ceramics or Fuji Titanium) is added to the composition. Additionally, the ferroelectric fillers may be coated with a dispersion agent to aid in dispersion within the composition. Solvents may be added to the composition to aid in dispersion. The solvent is not important just so long as it is compatible with the polymer and features of the desired composition. Examples of typical solvents include dimethlyacetamide and N-methylpyrrolidone, aliphatic alcohols, such as isopropanol, esters of such alcohols, for example, acetates and propionates; terpenes such as pine oil and alpha- or beta-terpineol, or mixtures thereof; ethylene glycol and esters thereof, such as ethylene glycol monobutyl ether and butyl cellosolve acetate; carbitol esters, such as butyl carbitol, butyl carbitol acetate and carbitol acetate and other appropriate solvents.

Film Formation

The composition of the present invention may be made into a "film" by supplying the paraelectric filler(s) and optionally, other additive filler(s), mixing the fillers with the desirable polymer, and casting the composition into the shape of a film by techniques known to those in the art, such as conventional die casting techniques. The film may be formed as a single layer or multilayer construction.

As a means of forming a multilayer construction, various methods known to those in the art may be utilized including: extrusion-lamination; thermal compression; solution coating, and coextrusion. These are typical, but not exclusive examples of the methods available for forming a multilayer film.

Formation of Electrical Component Utilizing the Composition/Film of the Present Invention The film of the present invention may be utilized in the formation of various electronic components, such as a capacitor, for example a planar capacitor laminate, formed from one or more layers of the dielectric composition of the present invention.

One particular utility for the composition(s) and film(s) is in dielectric composition(s) of the kind described in U.S. Pat. No. 6,600,645 for forming capacitors, filters and the like. Thus in one embodiment of the present invention, the invention is directed to a dielectric composition comprising a polymeric matrix having dispersed therein paraelectric fillers. In another embodiment, the invention is directed to an electrical capacitor comprising a dielectric composition disposed between two conductive electrodes wherein the dielectric composition comprises a polymeric matrix having the paraelectric filler of the instant invention dispersed therein. In still another embodiment, the invention is directed to a pre-fired ceramic dielectric for polymer thick-film capacitors comprising a polymer matrix having the particles of the instant invention dispersed therein. The use of the dielectric composition and film of the present invention may be incorporated into the formation of various aspects of electronic circuitry and electronic components; however, it's use in the formation of a planar capacitor laminate is described herein to represent one embodiment of the present invention.

The planar capacitor laminate may be formed from materials that may include metal foil-dielectric-metal foil laminate structures wherein the dielectric comprises one or more layers of the dielectric film of the present invention. Where multiple layers are used, layers may be of different materials. Such dielectrics would be manufactured with thin layers for impedance control.

Those skilled in the art will appreciate the above stated advantages and other advantages and benefits of various embodiments of the invention upon reading this detailed description of the embodiments with reference to the below-listed drawings.

According to common practice, the various features of the drawings are not necessarily drawn to scale. Dimensions of various features may be expanded or reduced to more clearly illustrate the embodiments of the invention.

Figure 2:
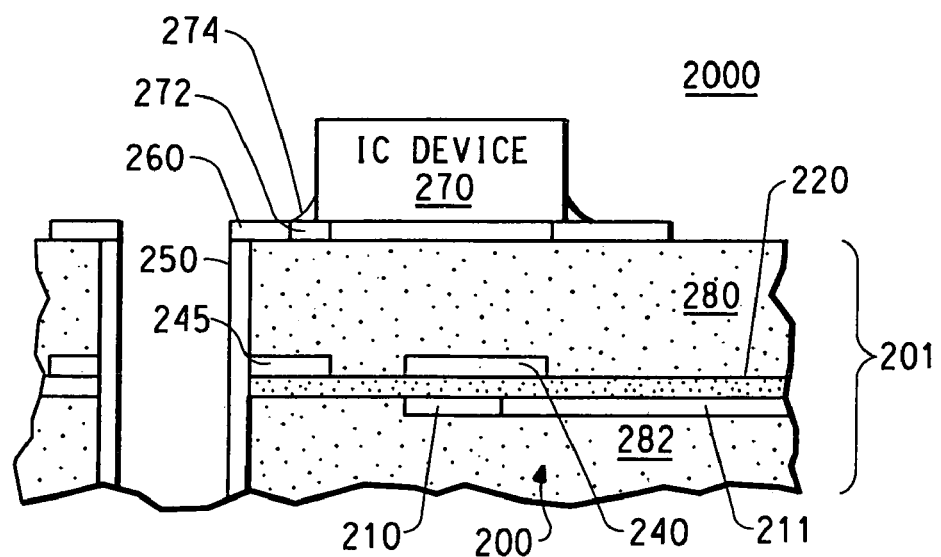
FIG. 2 is a section view of a portion of a printed wiring board having an embedded capacitive device according to one embodiment of the present invention.

FIG. 2 is a section view of a portion of a printed wiring board 2000. The printed wiring board section 2000 includes capacitor which is integrated into a capacitive device 200. The device 200 comprises a bottom electrode 210, a dielectric 220, a top electrode or top plate 240, and a conductive trace 245. The device 200 provides a capacitive function in a laminate structure, generally indicated by the bracket 201. The device 200 is coupled to an IC device 270 by the conductive circuit trace 245, a plated through hole via 250 extending through a dielectric layer 280, and a conductive circuit trace 260. The IC device 270 may be connected to the conductive circuit trace 260 by a solder pad 272 and a solder joint 274. A conductive circuit trace 211 may extend from the bottom electrode 210 for connection to ground or other circuitry.

Figure 3A:
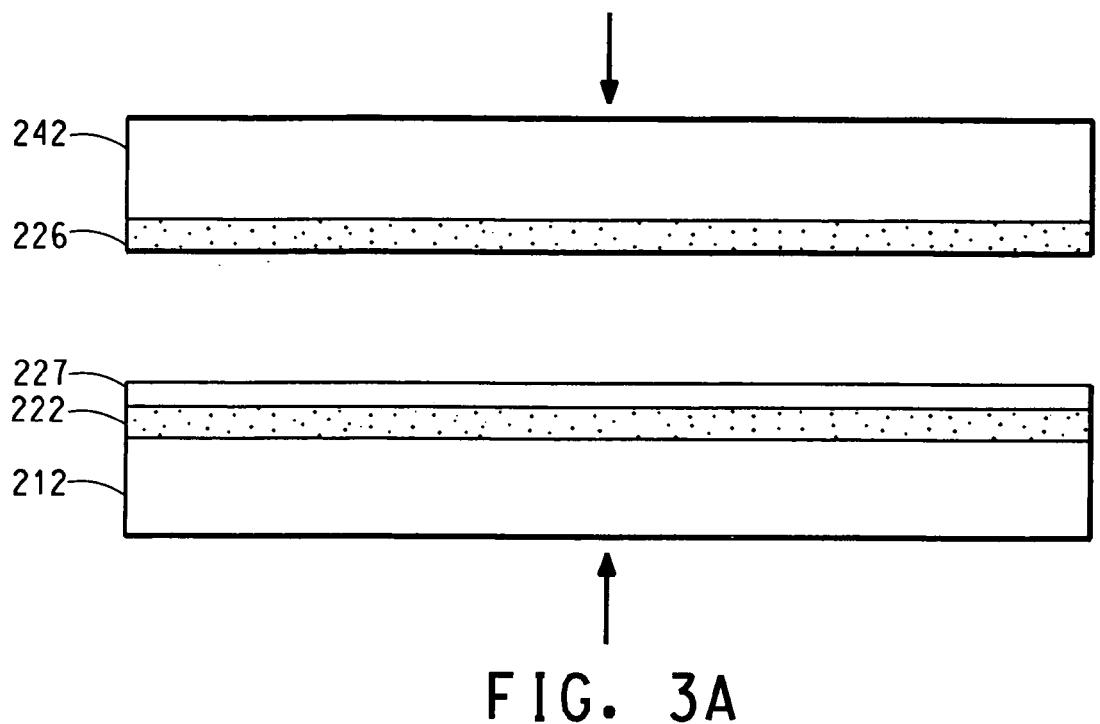
FIGS. 3A-3D illustrate a method of making a laminate structure including the capacitive device illustrated in FIG. 2.

FIGS. 3A-3D illustrate a method of making a laminate including the device 200. FIG. 3A is a section view in front elevation of a first stage of manufacture in which first and second metallic foils 212, 242 are provided. The first and second metallic foils 212, 242 can be made from, for example, copper, copper-based materials, and other metals.

The dielectric composition or film of the present invention may be cast or coated onto the first foil 212 and cured, forming a first dielectric layer 222. A similar, second dielectric layer 226 may be formed in a similar manner on the second foil 242.

A thin adhesive layer 227 may be applied to one or both surfaces of either of the dielectric layers 222, 226 (shown in FIG. 3A on the layer 222). The adhesive layer 227 may be formed from, for example, a thermoplastic polymer and may be filled with a high dielectric phase to avoid dilution of the dielectric constant. The two structures are then laminated together in the direction of the arrows shown in FIG. 3A.

Figure 3B:
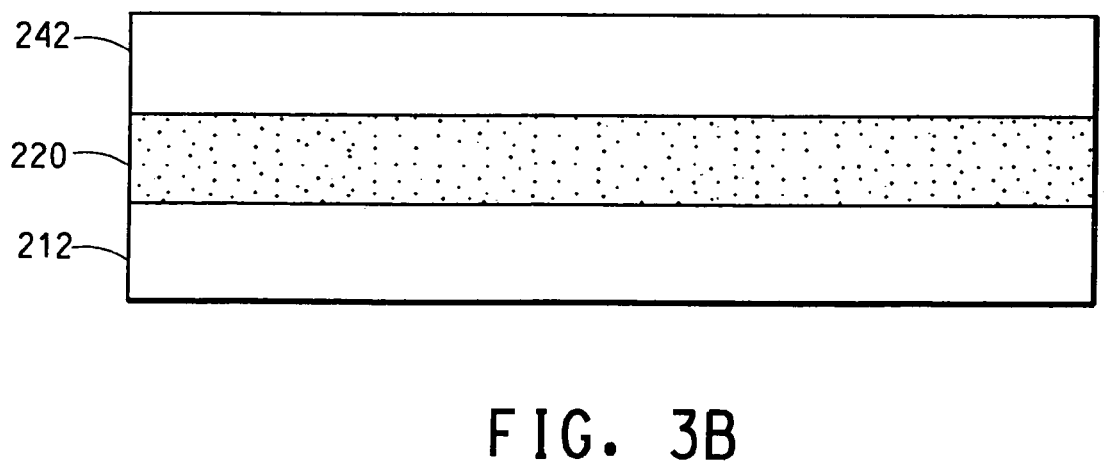

Referring to FIG. 3B, lamination forms a single dielectric 220 from the layers 222, 226 and 227. This paraelectric filler-containing dielectric layer of the present invention may have a dielectric constant in the range of 5 to 30. The adhesive layer 227 facilitates joining of the dielectric layers 222 and 226 during the lamination process. The adhesive layer 227, however, may be dispensed with if the dielectric layers 222 and 226 are only partially cured prior to lamination, or, are of a thermoplastic nature so that upon lamination a suitable temperature and pressure will sufficiently soften the resin so that the layers 224 and 226 bond without adhesive. The structure shown in FIG. 3B may also be formed by casting a slurry onto only one of the foils 212, 242 and laminating the other foil to the cured or partially cured slurry. Yet another alternative method would be to form a free-standing film of the cured or partially cured slurry 220 and laminate foils 212 and 242 to both sides of the polymer film 220.

A photoresist (not shown in FIG. 3B) is applied to the foil 212 and the foil 212 is imaged and etched, and the remaining photoresist stripped using standard printing wiring board processing conditions.

Figure 3C:
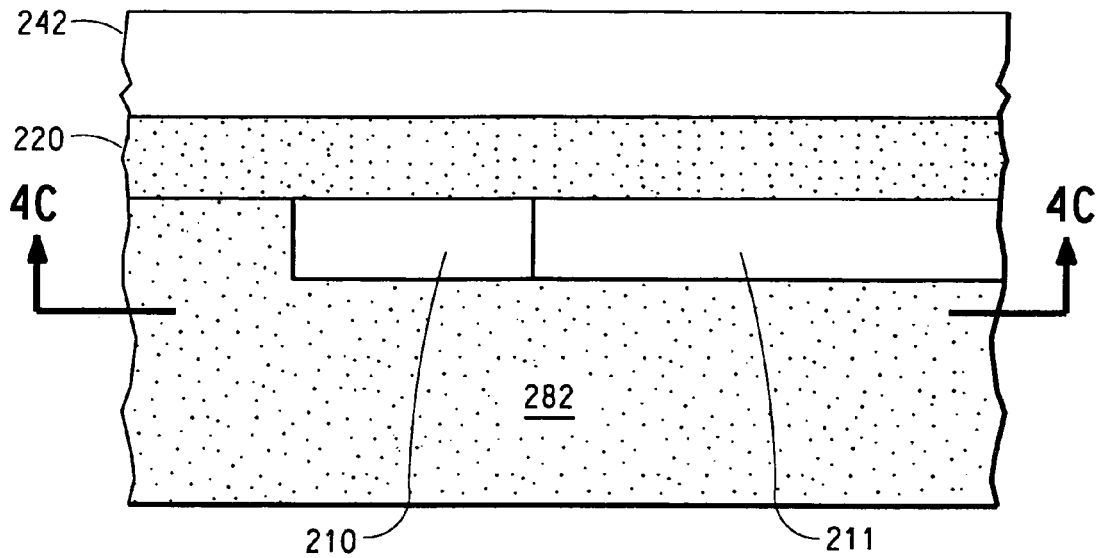

FIG. 3C is a section view in front elevation taken on line 4C-4C. Referring to FIG. 3C, the bottom electrode 210 side of the resulting article is laminated to a laminate material 282. The lamination can be performed, for example, using FR4 prepreg, or other prepregs, in standard printing wiring board processes.

Figure 3D:
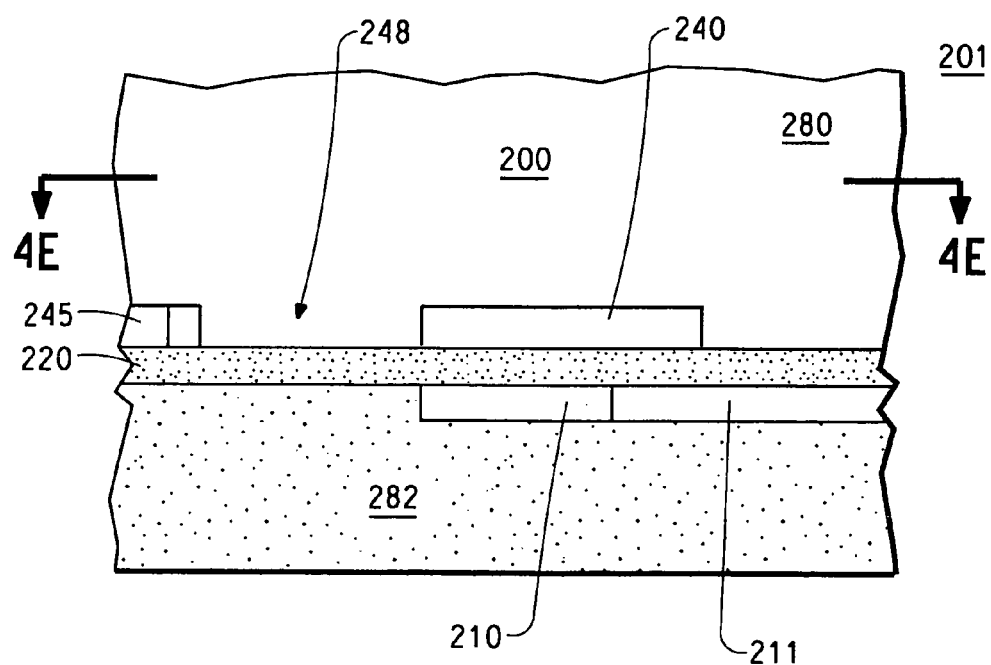

A photoresist (not shown in FIG. 3C) is applied to the foil 242 and the foil 242 is imaged and etched, and the remaining photoresist stripped. FIG. 3D is a section view in front elevation view of the resulting article, taken on line 4E-4E. Referring to FIG. 3D, the etching produces the top electrode 240 of the device 200 and the conductive circuit trace 245. Etching also produces a gap 248.

Referring to FIG. 3D, a dielectric layer 280 is laminated to the component side of the dielectric layer 282, forming a laminate structure 201. The laminate structure 201 can then be incorporated into, for example, a printed wiring board using conventional lamination and via formation processes.

The foregoing description of the invention illustrates and describes one embodiment of the present invention. Additionally, the disclosure shows and describes only selected preferred embodiments of the invention, but it is to be understood that the invention is capable of use in various other combinations, modifications, and environments and is capable of changes or modifications within the scope of the inventive concept as expressed herein, commensurate with the above teachings, and/or within the skill or knowledge of the relevant art.

The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments, not explicitly defined in the detailed description.

EXAMPLE 1

A solution of 160 grams of a polyamic acid derived from the following monomers: pyromellitic dianhydride (PMDA), 4,4'-oxydiphthalic anydride (ODPA) and 1,3-bis-(4-aminophenoxy) benzene (APB-134) was mixed with 120 grams of Dimethylacetamide (DMAC) solvent and 30 grams of DuPont Ti-Pure® R-101 titanium dioxide powder. This solution was stirred in a high speed mixer until the powder was dispersed. Small amounts of additional monomer were added until a viscosity of 500 poise was reached. This solution was then coated on solid surface as a uniform coating. The coating was then dried at 170° C. to remove about 70 to 80% of the solvent. The formed film was then removed from the solid surface. This film was then cured in an oven at 350° C. for 1 hour. The final film thickness was 1.1 mils and the filler loading was 26 volume percent.

The cured titanium dioxide filled film was then laminated between two sheets of copper foil. Each copper sheet was 36 microns thick. The lamination press cycle started by holding sheets at 250° C. for 1.5 hours under vacuum. A pressure of 10 psi was applied to the sheets for the last ½ hour. The temperature was then raised to 350° C. for an additional 1 hour. After 30 minutes at the higher temperature, the pressure was increased to 352 psi. The heat was then turned off and after cooling the samples were removed.

Using photoresist imaging and copper etching, 1 inch diameter capacitors were imaged for testing. Electrical testing of the imaged capacitors showed that they could pass 500 volts DC in the dielectric withstanding voltage test. At 3 volts the resistance across the dielectric was greater than $10^{10}$ ohms per $cm^2$. The leakage current at 100 volts DC was less than 0.1 microamp per $cm^2$. A similar sample filled with barium titanate, a ferroelectric filler, had resistance at 3 volts of $4 \times 10^8$ ohms per $cm^2$, would pass only 100 volts DC in the dielectric withstanding voltage test, and would have leakage current at 100 volts DC of over 100 microamps per $cm^2$.

EXAMPLE 2

A solution of 18 lbs of DMAC and 18 lbs of DuPont Ti-Pure® R-101 titanium dioxide powder was stirred for 1 hour in a high-speed mixer. Then 84 lbs of a polyamic acid derived from the following monomers: pyromellitic dianhydride (PMDA), 4,4'-oxydiphthalic anydride (ODPA) and 1,3-bis-(4-aminophenoxy) benzene (APB-134) was added. This mixture was stirred for an additional 30 minutes. Small amounts of additional monomer were added until a viscosity of 400 poise was reached.

This solution was then cast on to a continued sheet of copper foil (36 microns thick). The solution was dried at 190° C. to about 90% solids. The coated copper was then cured in an oven at 350° C. for 1 hour. The final film thicknesses were 8 and 12 microns. The filler loading was 29 volume percent.

The filled polyimide film coated on copper was then laminated to a sheet of copper foil. The copper sheet was 35 microns thick. The lamination used an autoclave under vacuum with maximum lamination temperature of 350° C.

Using photoresist imaging and copper etching, 1 inch diameter capacitors were imaged for testing. Electrical testing of the imaged capacitors showed that they could pass 250 volts DC in the dielectric withstanding voltage test for the 8 micron thick dielectric sample. At 3 volts the resistance across the dielectric was greater than $10^{10}$ ohms per $cm^2$. The leakage current at 100 volts DC was less than 0.1 microamp per $cm^2$.

What is claimed is:

1. A capacitor consisting essentially of a dielectric composition comprising a paraelectric filler and a polymeric material said dielectric composition disposed between two conductive electrodes;
    wherein said filler has a dielectric constant between 50 and 150;
    wherein said paraelectric filler is selected from the group consisting of $Ta_2O_5$, $Hf_2O_5$, $Nb_2O_5$, Steatite and mixtures thereof, and
    wherein said paraelectric filler is present in an amount of 5 to 55 volume percent.

2. The capacitor of claim 1 wherein the average particle size of said paraelectric filler is less than 2 microns.

3. The capacitor of claim 1 wherein said polymer is selected from an epoxy, acrylic, polyurethane and polyimide.

4. The capacitor of claim 1 further comprising a ferroelectric filler.

5. The capacitor of claim 4 wherein said ferroelectric filler is selected from the group consisting of perovskites of the general formula $ABO_3$, crystalline barium titanate (BT), barium strontium titanate (BST), lead zirconate titanate (PZT), lead lanthanum titanate, lead lanthanum zirconate titanate (PLZT), lead magnesium niobate (PMN), calcium copper titanate and mixtures thereof.

6. The capacitor of claim 1 wherein said composition has been processed to form a film.

7. A method of forming an embedded planar capacitor comprising:
    providing the dielectric composition of claim 1; applying said dielectric composition of claim 1 to a first metallic layer, thus forming a metallic side and a dielectric side; and applying a second metallic layer to said dielectric side.

8. An embedded planar capacitor formed by the method of claim 7.

9. A printed wiring board comprising the capacitor of claim 1.

* * * * *